United States Patent
Komiya et al.

(10) Patent No.: US 9,590,617 B2
(45) Date of Patent: Mar. 7, 2017

(54) SEMICONDUCTOR DEVICE, AND INVERTER, CONVERTER AND POWER CONVERSION DEVICE EMPLOYING THE SAME

(75) Inventors: Kenji Komiya, Osaka (JP); Shuji Wakaiki, Osaka (JP); Kohtaroh Kataoka, Osaka (JP); Masaru Nomura, Osaka (JP); Yoshiji Ohta, Osaka (JP); Hiroshi Iwata, Osaka (JP)

(73) Assignee: SHARP KABUSHIKI KAISHA, Osaka-shi (JP)

( * ) Notice: Subject to any disclaimer, the term of this patent is extended or adjusted under 35 U.S.C. 154(b) by 2 days.

(21) Appl. No.: 14/110,687

(22) PCT Filed: Apr. 5, 2012

(86) PCT No.: PCT/JP2012/059319
§ 371 (c)(1),
(2), (4) Date: Oct. 8, 2013

(87) PCT Pub. No.: WO2012/137860
PCT Pub. Date: Oct. 11, 2012

(65) Prior Publication Data
US 2014/0028375 A1    Jan. 30, 2014

(30) Foreign Application Priority Data

Apr. 8, 2011 (JP) ................................ 2011-086116
Mar. 29, 2012 (JP) ................................ 2012-076613

(51) Int. Cl.
*H03K 17/30* (2006.01)
*H03K 17/10* (2006.01)
(Continued)

(52) U.S. Cl.
CPC .......... *H03K 17/302* (2013.01); *H02M 1/088* (2013.01); *H02M 3/158* (2013.01);
(Continued)

(58) Field of Classification Search
CPC .. H03K 17/102; H03K 17/122; H03K 17/145; H03K 17/302; H02M 2003/078;
(Continued)

(56) References Cited

U.S. PATENT DOCUMENTS 5,357,125 A   10/1994   Kumagi
5,406,096 A    4/1995   Malhi
(Continued)

FOREIGN PATENT DOCUMENTS

JP    5-75110      3/1993
JP    5-48434 U    6/1993
(Continued)

OTHER PUBLICATIONS

International Search Report dated Jun. 19, 2012, directed to International Patent Application No. PCT/JP2012/059319; 3 pages.
(Continued)

*Primary Examiner* — Lincoln Donovan
*Assistant Examiner* — Colleen O Toole
(74) *Attorney, Agent, or Firm* — Morrison & Foerster LLP

(57) ABSTRACT

A semiconductor device includes a high breakdown voltage, high Gm first transistor and a low breakdown voltage, low Gm second transistor connected in series between first and second nodes, and a low breakdown voltage, high Gm third transistor connected to the second transistor in parallel. When the second transistor is turned on, the first transistor turns on, and furthermore, when the third transistor is turned on, an electrically conducting state is established between the first and second nodes. The second, low breakdown voltage transistor is turned on to turn on the first, high breakdown voltage transistor, and a turn-on time with only limited variation can be achieved.

20 Claims, 14 Drawing Sheets

(51) Int. Cl.
    *H03K 17/14*     (2006.01)
    *H03K 17/12*     (2006.01)
    *H02M 3/158*     (2006.01)
    *H02M 1/088*     (2006.01)

(52) U.S. Cl.
    CPC ......... *H03K 17/102* (2013.01); *H03K 17/145* (2013.01); *H03K 17/122* (2013.01)

(58) Field of Classification Search
    CPC .. H02M 2001/0045; H03F 1/22; H03F 1/223; H03F 2200/366; H03F 2203/21178
    See application file for complete search history.

(56) References Cited

U.S. PATENT DOCUMENTS

| | | | | |
|---|---|---|---|---|
| 6,703,895 | B1* | 3/2004 | Khemka et al. | 327/564 |
| 6,937,086 | B1* | 8/2005 | You et al. | 327/404 |
| 7,939,857 | B1* | 5/2011 | Wyatt | 257/205 |
| 2006/0091962 | A1 | 5/2006 | Kim et al. | |
| 2007/0222515 | A1 | 9/2007 | Koutani et al. | |
| 2012/0307540 | A1 | 12/2012 | Tagome | |

FOREIGN PATENT DOCUMENTS

| | | |
|---|---|---|
| JP | 7-106573 | 4/1995 |
| JP | 2002-95240 | 3/2002 |
| JP | 2004-40854 | 2/2004 |
| JP | 2007-221473 | 8/2007 |
| JP | 4354465 | 10/2009 |
| WO | WO-2011/096232 | 11/2011 |

OTHER PUBLICATIONS

Oh, H-S. et al. "A Fully-Integrated +23-dBm CMOS Triple Cascode Linear Power Amplifier with Inner-Parallel Power Control Scheme," *Radio Frequency Integrated Circuits (RFIC) Symposium*, Jun. 11-13, 2006. San Francisco, CA; 4 pages.

* cited by examiner (a) WHEN TURNED ON (b) WHEN TURNED OFF (a) WHEN TURNED ON (b) WHEN TURNED OFF

SEMICONDUCTOR DEVICE, AND INVERTER, CONVERTER AND POWER CONVERSION DEVICE EMPLOYING THE SAME

REFERENCE TO RELATED APPLICATIONS

This application is a national stage application under 35 USC 371 of International Application No. PCT/JP2012/059319, filed Apr. 5, 2012, which claims the priority of Japanese Patent Application Nos. 2011-086116, filed Apr. 8, 2011, and 2012-076613, filed Mar. 29, 2012, the entire contents of which are incorporated herein by reference.

FIELD OF THE INVENTION

The present invention relates to a semiconductor device, and a boost chopper and power conversion device employing the same, and more specifically to a semiconductor device including a high breakdown voltage transistor, and an inverter, converter and power conversion device employing the same.

BACKGROUND OF THE INVENTION

Conventionally, power conversion devices employ a high breakdown voltage transistor. Furthermore, there is also a method using a plurality of high breakdown voltage transistors connected in parallel to allow a power conversion device to have an increased rated current. In this method, the plurality of high breakdown voltage transistors are prevented from having a high breakdown voltage transistor with a low threshold voltage receiving a current intensively, as follows: Each high breakdown voltage transistor's current is sensed, and if the high breakdown voltage transistors have currents passing therethrough with a difference therebetween larger than a predetermined value, a gate resistance is reduced to be smaller than normal to turn on the high breakdown voltage transistors faster (see Japanese Patent Laying-Open No. 2002-095240 (PTD 1) for example).

PATENT DOCUMENT

PTD 1: Japanese Patent Laying-Open No. 2002-095240

SUMMARY OF INVENTION

Conventional power conversion devices, however, vary in performance, as their high breakdown voltage transistors have a varying threshold voltage and as a result have a varying turn-on time.

Furthermore, the method of PTD 1 requires the same number of current sensors as the high breakdown voltage transistors, each gate resistor to be implemented as a variable resistive element, and a control unit to control the gate resistor, based on the sensed results of the current sensors, resulting in the device having a complicated configuration and hence being costly.

Accordingly, a major object of the present invention is to provide a semiconductor device having a turn-on time with only limited variation, and an inverter, converter and power conversion device employing the same.

The present invention provides a semiconductor device including: a first transistor having a first electrode connected to a first node; a second transistor having a first electrode connected to a second electrode of the first transistor, and a second electrode connected to a second node; and a third transistor connected to the second transistor in parallel. The first transistor has a higher breakdown voltage between the first and second electrodes than the second and third transistors do. The second transistor has an amplification factor smaller than that of the third transistor.

Preferably, the semiconductor device includes a plurality of sets of first to third transistors. A plurality of first transistors have control electrodes, respectively, connected to each other. A plurality of second transistors have control electrodes, respectively, connected to each other. A plurality of third transistors have control electrodes, respectively, connected to each other. The plurality of first transistors have first electrodes, respectively, all connected to the first node. The plurality of second transistors have first electrodes, respectively, connected to the plurality of first transistors at second electrodes, respectively. The plurality of second transistors have second electrodes, respectively, all connected to the second node. The plurality of third transistors are connected to the plurality of second transistors, respectively, in parallel.

Furthermore, preferably, the semiconductor device further includes: a first resistive element associated with each first transistor; a second resistive element associated with each second transistor; and a third resistive element associated with each third transistor. Each first transistor has the control electrode connected to a first control node via the first resistive element associated therewith. Each second transistor has the control electrode connected to a second control node via the second resistive element associated therewith. Each third transistor has the control electrode connected to a third control node via the third resistive element associated therewith.

Furthermore, preferably, the second transistor has the amplification factor to be smaller than that of the first transistor.

Furthermore, preferably, an electrically conducting state is established between the first and second nodes by turning on the second transistor to turn on the first transistor and thereafter turning on the third transistor.

Furthermore, preferably, an electrically non conducting state is established between the first and second nodes by turning off the third transistor and thereafter turning off the second transistor to turn off the first transistor.

Furthermore, preferably, the first node receives a first voltage, and the second node receives a second voltage. A first control signal is provided to a control electrode of the second transistor to control turning on/off the second transistor, and a second control signal is provided to a control electrode of the third transistor to control turning on/off the third transistor.

Furthermore, preferably, the first node receives a first voltage, and the second node receives a second voltage. The second transistor has a threshold voltage lower than that of the third transistor. A control signal is provided to the second and third transistors at control electrodes, respectively, to control turning on/off the second and third transistors.

Furthermore, preferably, the second and third transistors are each a normally off type transistor.

Furthermore, preferably, the first transistor is a normally off type transistor, and the first transistor has a control electrode receiving a third voltage higher than a threshold voltage of the first transistor.

Furthermore, preferably, the semiconductor device further includes: a capacitor connected between the control electrode of the first transistor and the second node; and a diode having a cathode connected to the control electrode of the first transistor, and an anode receiving the third voltage.

Furthermore, preferably, the first transistor is a normally on type transistor, and the first transistor has a control electrode connected to the second node.

Furthermore, the present invention provides a converter including the above semiconductor device.

Furthermore, the present invention provides an inverter including the above semiconductor device.

Furthermore, the present invention provides a power conversion device including the above semiconductor device.

The present semiconductor device includes first and second transistors connected in series between first and second nodes, and a third transistor connected to the second transistor in parallel. The first transistor has first and second electrodes with a higher breakdown voltage therebetween than the second and third transistors do. The second transistor has an amplification factor smaller than that of each of the first and third transistors. The second transistor with the smaller amplification factor can be used to switch the first, high breakdown voltage transistor and hence reduce an effect of variation in threshold voltage of the first transistor on that of a current of the first and second electrodes of the first transistor. This allows a plurality of semiconductor devices to be connected in parallel without requiring a current sensor or the like to prevent a single semiconductor device from intensively receiving a current, and thus allows the device to be simplified in configuration and reduced in cost.

DETAILED DESCRIPTION OF THE INVENTION

First Embodiment

A first embodiment provides a semiconductor device including: a first transistor having a drain connected to a first node; a second transistor having a drain connected to a source of the first transistor, and a source connected to a second node; and a third transistor connected to the second transistor in parallel, the first transistor having a source-drain breakdown voltage higher than those of the second and third transistors, the second transistor having a transconductance smaller than that of the third transistor. Hereinafter, the semiconductor device of the first embodiment will be described in detail with reference to the drawings.

Figure 1:
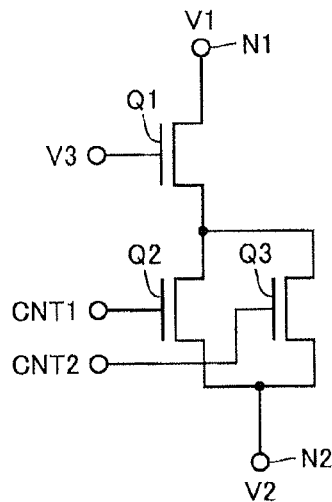
FIG. 1 is a circuit diagram showing a configuration of a semiconductor device by a first embodiment of the present invention.

As shown in FIG. 1, the semiconductor device of the first embodiment includes n channel MOS transistors Q1 and Q2 connected in series between a node N1 and a node N2, and an n channel MOS transistor Q3 connected to n channel MOS transistor Q2 in parallel.

Transistor Q1 is a high breakdown voltage transistor, and transistors Q2 and Q3 are each a low breakdown voltage transistor. Transistor Q1 as commercially available has a threshold voltage VTH1 varying in a range of 3 V to 5 V. Transistors Q2 and Q3 as commercially available have threshold voltages VTH2 and VTH3, respectively, varying in a range of 1 V to 2 V. Transistors Q1, Q2, Q3 have transconductances Gm1, Gm2, Gm3, respectively, and transconductance Gm2 is smaller than transconductances Gm1 and Gm3. For example, Gm2=6 siemens (S), Gm1=35 S, and Gm3=30 S.

Node N1 receives direct current voltage V1, node N2 receives direct current voltage V2 lower than direct current voltage V1, and transistor Q1 has a gate receiving direct current voltage V3. V3 minus V2 is set to be a voltage sufficiently larger than threshold voltage VTH1 of transistor Q1. Transistors Q2 and Q3 have gates, respectively, receiving control signals CNT1 and CNT2, respectively.

In an initial state, control signals CNT1 and CNT2 are both set low for the sake of illustration. In this case, transistors Q1-Q3 are all turned off, and an electrically non-conducting state is established between nodes N1 and N2.

To establish an electrically conducting state between nodes N1 and N2, control signal CNT1 is initially pulled from low to high. This turns on transistor Q2 and transistor Q1 has a decreased source voltage, and when transistor Q1 attains a gate-source voltage exceeding threshold voltage VTH1 of transistor Q1, transistor Q1 turns on and the electrically conducting state is established between nodes N1 and N2. Subsequently, control signal CNT2 is pulled from low to high. This turns on transistor Q3 and a value in resistance between nodes N1 and N2 is reduced to a small value contributing to a reduced conduction loss.

Furthermore, to shift the electrically conducting state between node N1 and N2 to the electrically non-conducting state, control signal CNT2 is initially pulled from high to low to turn off transistor Q3. Subsequently, control signal CNT is pulled from high to low. This turns off transistor Q2 and transistor Q1 has an increased source voltage, and when transistor Q1 attains a gate-source voltage smaller than threshold voltage VTH1 of transistor Q1, transistor Q1 turns off.

In the first embodiment, transistor Q2 with transconductance Gm2 having a small value is used to switch high breakdown voltage transistor Q1 and hence reduce an effect of variation in threshold voltage VTH1 of transistor Q1 on that of a drain current of transistor Q1, and a turn-on time with only limited variation can be achieved.

Figure 2:
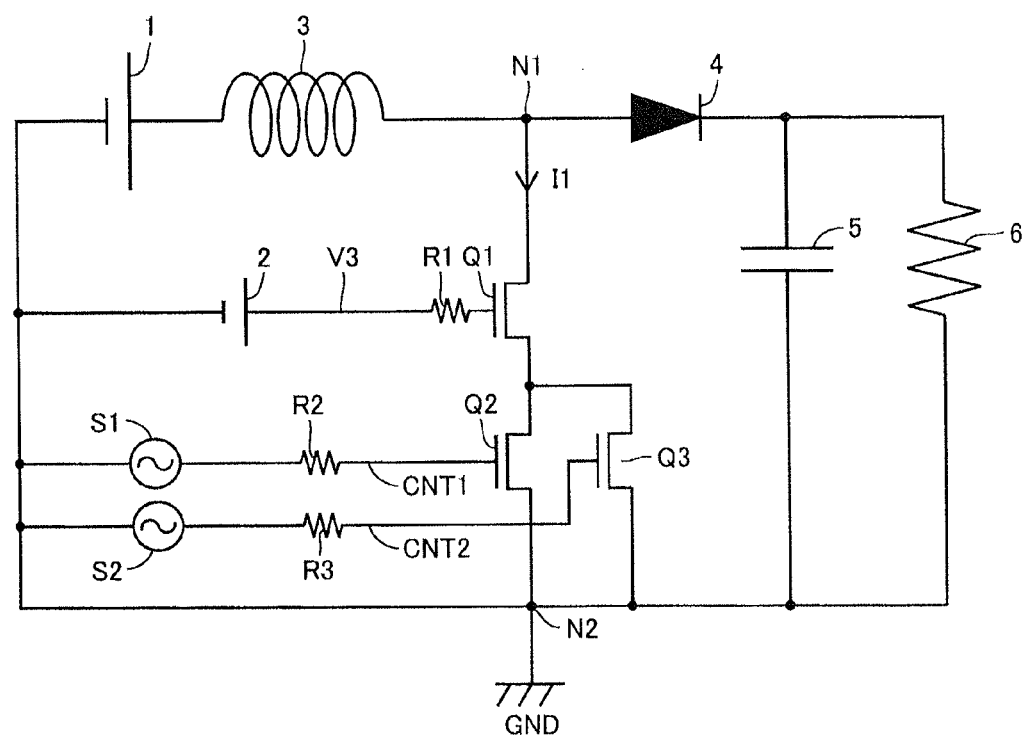
FIG. 2 is a circuit diagram showing a configuration of a boost chopper employing the semiconductor device shown in FIG. 1.

FIG. 2 is a circuit diagram showing a configuration of a boost chopper employing the semiconductor device shown in FIG. 1. In FIG. 2, the boost chopper is a circuit that boosts a voltage output from a direct current power supply 1, and includes n channel MOS transistors Q1-Q3, control signal sources S1 and S2, gate resistors R1-R3, a direct current power supply 2, a diode 4, and a capacitor 5.

N channel MOS transistors Q1 and Q2 are connected in series between nodes N1 and N2, and n channel MOS transistor Q3 is connected to n channel MOS transistor Q2 in parallel. Node N2 is connected to a line of ground voltage GND. A reactor 3 is connected between a positive electrode of direct current power supply 1 and node N1. Diode 4 has an anode connected to node N1, and a cathode connected to a line of ground voltage GND via capacitor 5. A load circuit 6 is connected to capacitor 5 in parallel.

Gate resistor R1 is connected between a positive electrode of direct current power supply 2 and a gate of transistor Q1. Gate resistor R2 is connected between an output node of control signal source S1 and a gate of transistor Q2. Gate resistor R3 is connected between an output node of control signal source S2 and a gate of transistor Q3. Direct current power supplies 1 and 2 have their respective negative electrodes grounded, and signal sources S1 and S2 have a ground node grounded.

Reactor 3 has a reactance for example of 5 mH. Diode 4 is implemented as a SiC Schottky barrier diode. Capacitor 5 has a value in capacitance for example of 200 Load circuit 6 is implemented as a resistive element having a value in resistance of 7.8 ohms. Control signal sources S1 and S2 output control signals CNT1 and CNT2, respectively. Control signals CNT1 and CNT2 are each a 10-kHz rectangular wave signal.

Figure 3:
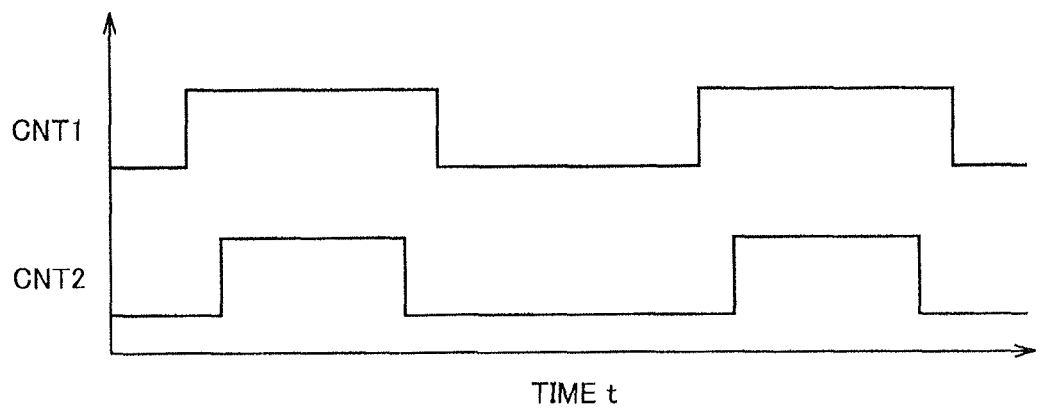
FIG. 3 is timing plots representing control signals shown in FIG. 2 in waveform.

To turn on transistors Q1-Q3, as shown in FIG. 3, control signal CNT1 is pulled from low to high and control signal CNT2 is subsequently pulled from low to high. To turn off transistors Q1-Q3, control signal CNT2 is pulled from high to low and control signal CNT1 is subsequently pulled from high to low.

Returning to FIG. 2, when transistors Q1-Q3 are turned on, a direct current flows from direct current power supply 1 via reactor 3 and transistors Q1-Q3 to a line of ground voltage GND, and electromagnetic energy is stored to reactor 3. When transistors Q1-Q3 are turned off, the electromagnetic energy stored in reactor 3 is discharged to capacitor 5 via diode 4. Capacitor 5 will have a voltage between its terminals, i.e., a voltage output from the boost chopper, which is a voltage output from direct current power supply 1 plus that between the terminals of reactor 3.

Figure 4:
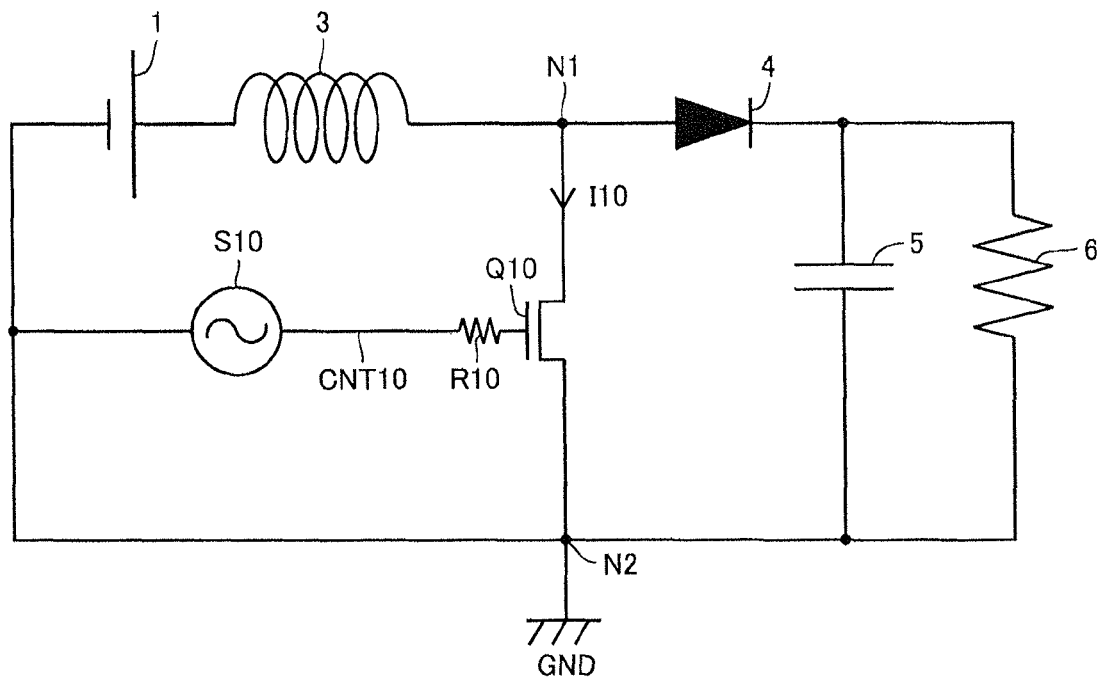
FIG. 4 is a circuit diagram showing a comparative example for the first embodiment.

FIG. 4 is a circuit diagram showing a conventional boost chopper serving as a comparative example for the first embodiment, as compared with FIG. 2. With reference to FIG. 4, this boost chopper has an n channel MOS transistor Q10 connected between nodes N1 and N2. Transistor Q10 has a gate connected to an output node of a control signal source S10 via a gate resistor R10. Control signal source S10 outputs a control signal S10 that is a 10-kHz rectangular wave signal. Control signal source S10 has a ground node grounded. Transistor Q10 is implemented as a transistor as high in breakdown voltage and Gm as transistor Q1.

When control signal S10 is pulled from low to high, transistor Q10 turns on and electromagnetic energy is stored to reactor 3. When control signal S10 is pulled from high to low, transistor Q10 turns off and the electromagnetic energy of reactor 3 is discharged to capacitor 5.

Figure 5:
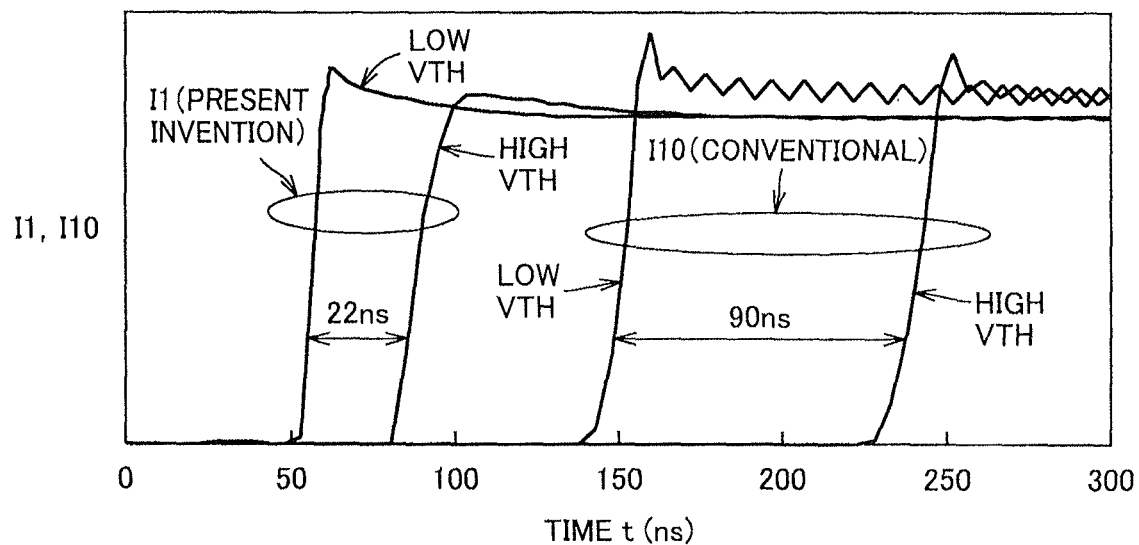
FIG. 5 is a timing plot for illustrating an effect of the present invention.

FIG. 5 is a timing plot representing a waveform of a current I1 flowing in the FIG. 2 boost chopper of the present invention through transistor Q1 in response to a rising edge of control signals CNT1 and CNT2, and a waveform of a current I10 flowing in the FIG. 4 conventional boost chopper through transistor Q10 in response to a rising edge of control signal CNT10.

Herein at Time t=0 (ns) transistors Q2, Q10 have their gate voltages pulled from low to high. Furthermore, the boost chopper of the present invention and the conventional boost chopper have gate resistors R1, R2 and R3, and R10 with their respective values in resistance set so that the boost choppers have equal rates of change in current (di/dt) while switching. A rate of change in current (di/dt) while switching is a parameter set by tolerance of switching noise, and an increased rate of change in current (di/dt) while switching results in increased switching noise. The boost chopper of the present invention and the conventional boost chopper are equal in tolerance of switching noise, and accordingly, they have a circuit parameter set to also have equal rates of change in current (di/dt) while switching.

In general, even identically produced transistors Qs still have a threshold voltage VTH varying within a range. High breakdown voltage transistors Q1, Q10 as commercially available have threshold voltage VTH varying in a range of 3 V to 5 V. Low breakdown voltage transistors Q2, Q3 as commercially available have threshold voltage VTH varying in a range of 1 V to 2 V. When control signal CNT is pulled from low to high and attains a level exceeding threshold voltage VTH of transistor Q, transistor Q turns on. As such, if transistors Qs receive the same control signal CNT at their respective gates, transistor Q having a low threshold voltage VTH turns on faster than transistor Q having a high threshold voltage VTH The conventional boost chopper with high breakdown voltage transistor Q10 having a low VTH (VTH10=3 V) has current I10 rising faster by 90 ns than that with high breakdown voltage transistor Q10 having a high VTH (VTIH10=5 V) does. Accordingly, current I10 rises at a time varying within a range of 90 ns.

In contrast, the boost chopper of the present invention with high breakdown voltage transistor Q1 having a low VTH (VTH1=3 V), low breakdown voltage transistor Q2 having a low VTH (VTH2=1 V), and low breakdown voltage transistor Q3 having a low VTH (VTH3=1.2 V) has current I1 rising faster by 22 ns than that with high breakdown voltage transistor Q1 having a high VTH (VTH1=5 V), low breakdown voltage transistor Q2 having a high VTH (VTH2=2 V), and low breakdown voltage transistor Q3 having a high VTH (VTH3=2 V) does. Accordingly, current I1 rises at a time varying within a range of 22 ns.

Thus, while a conventional boost chopper has a current rising at a time varying in a range of 90 ns, the semiconductor device of the present invention allows a boost chopper to have a current rising at a time varying within only a limited range of 22 ns. This is because transistor Q2 with transconductance Gm2 having a small value can be used to switch high breakdown voltage transistor Q1 and hence reduce an effect of variation in threshold voltage VTH1 of transistor Q1 on that of a drain current of transistor Q1.

In general, transistor Q has a drain current Id of represented by Id=Gm×(Vg−VTH)×Vd, where Vg represents gate voltage and Vd represents drain voltage. Accordingly, fixing drain voltage Vd and, in that condition, allowing transistor Q having transconductance Gm of a small value to have current Id of a prescribed value passing therethrough, require (Vg−VTH) to have a larger value than allowing transistor Q having transconductance Gm of a large value to have current Id of that prescribed value passing therethrough does. Thus, for transistor Q having transconductance Gm of a small value, gate voltage Vg is increased to be larger than variation in threshold voltage VTH, and an effect of variation in threshold voltage VTH on drain current Id can thus be reduced.

Furthermore, the boost chopper of the present invention has current I1 rising approximately 50 ns after transistor Q2 having a low VTH has its gate voltage pulled high. In contrast, the conventional boost chopper has current I10 rising approximately 140 ns after transistor Q10 having a low VTH has its gate voltage pulled high. Thus a boost chopper having the semiconductor device of the present invention mounted therein has a shorter period of time after transistor Q2 has its gate voltage pulled high before the boost chopper has a rising current, and the boost chopper can thus operate at a higher frequency than the conventional boost chopper.

Figure 6:
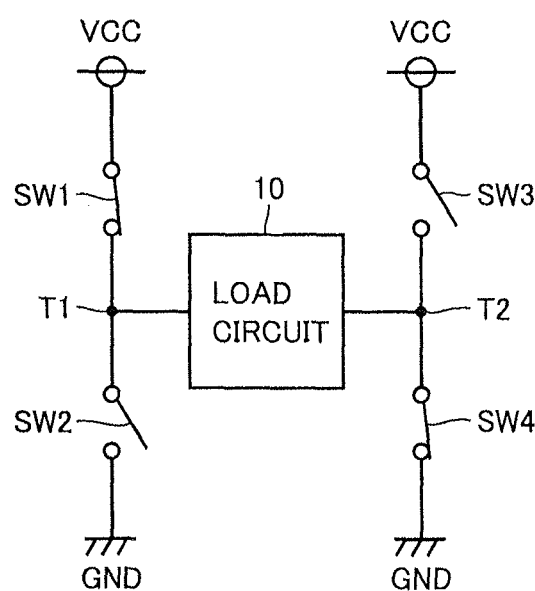
FIG. 6 is a circuit block diagram showing an exemplary variation of the first embodiment.

Hereinafter, the first embodiment in a variety of exemplary variations will be described. FIG. 6 is a circuit block diagram showing a configuration of an inverter serving as an exemplary variation of the first embodiment. In FIG. 6, the inverter includes switches SW1 and SW2 connected in series between a line of direct current power supply voltage VCC and a line of ground voltage GND, an output terminal T1 provided between switches SW1 and SW2, switches SW3 and SW4 connected in series between a line of direct current power supply voltage VCC and a line of ground voltage GND, and an output terminal T2 provided between switches SW3 and SW4. Furthermore, a diode (not shown) is connected to each switch SW in antiparallel. Each switch SW is configured of the semiconductor device shown in FIG. 1. A load circuit 10 is connected between output terminals T1 and T2.

When switches SW1 and SW4 are turned on, a current flows through a line of direct current power supply voltage VCC via switch SW1, load circuit 10 and switch SW4 to a line of ground voltage GND. When switches SW3 and SW2 are turned on, a current flows through a line of direct current power supply voltage VCC via switch SW3, load circuit 10 and switch SW2 to a line of ground voltage GND. Switches SW1 and SW4, and switches SW2 and SW3 can alternately be turned on cyclically as desired to convert direct current power to alternating current power and thus supply load circuit 10 therewith. This exemplary variation allows switch SW to have a turn-on time with only limited variation. Note that while in this exemplary variation the semiconductor device of the first embodiment is applied to a single-phase inverter, it is needless to say that the semiconductor device of the first embodiment is also applicable to a multiphase inverter (e.g., a three-phase inverter).

Figure 7:
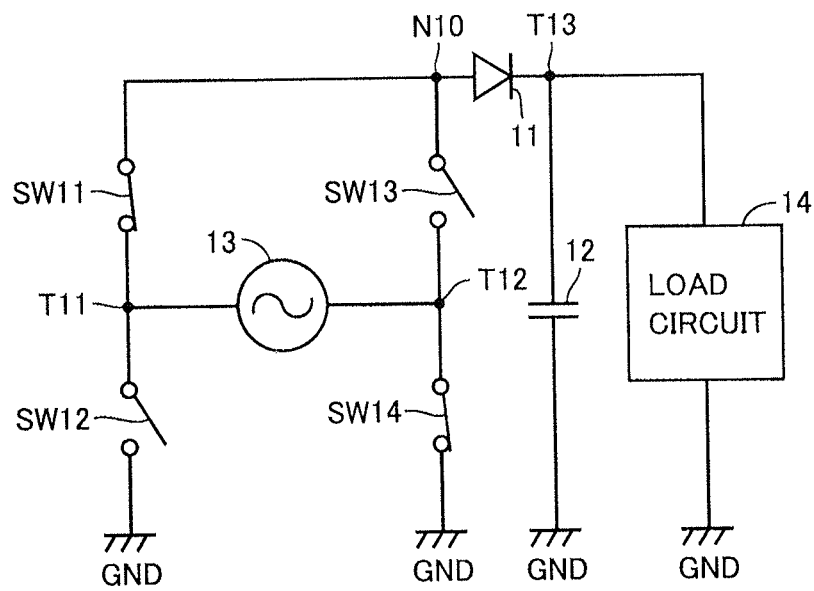
FIG. 7 is a circuit block diagram showing another exemplary variation of the first embodiment.

FIG. 7 is a circuit block diagram showing a configuration of a converter serving as another exemplary variation of the first embodiment. In FIG. 7, the converter includes switches SW11 and SW12 connected in series between a node N10 and a line of ground voltage GND, an input terminal T11 provided between switches SW11 and SW12, switches SW13 and SW14 connected in series between node N10 and a line of ground voltage GND, an input terminal T12 provided between switches SW13 and SW14, an output terminal T13, a diode 11 connected between node N10 and output terminal T13 in a forward direction, and a smoothing capacitor 12 connected between output terminal T13 and a line of ground voltage GND. Each switch SW is configured of the semiconductor device shown in FIG. 1. An alternating current power supply 13 is connected between input terminals T11 and T12. A load circuit 14 is connected between output terminal T13 and a line of ground voltage GND.

Between input terminals T11 and T12, alternating current voltage is supplied from alternating current power supply 13. When input terminal T11 is higher in voltage than input terminal T12, switches SW11 and SW14 are turned on. When input terminal 112 is higher in voltage than input terminal T11, switches SW12 and SW13 are turned on.

When switches SW11 and SW14 are turned on, a current flows from alternating current power supply 13 via switch SW11 and diode 11 to smoothing capacitor 12 to thus charge smoothing capacitor 12. When switches SW12 and SW13 are turned on, a current flows from alternating current power supply 13 via switch SW13 and diode 11 to smoothing capacitor 12 to thus charge smoothing capacitor 12. Accordingly, switches SW11 and SW14, and switches SW12 and SW13 can be turned on in synchronization with alternating current voltage to convert alternating current power to direct current power and thus supply load circuit 14 therewith. This exemplary variation allows switch SW to have a turn-on time with only limited variation.

Figure 8:
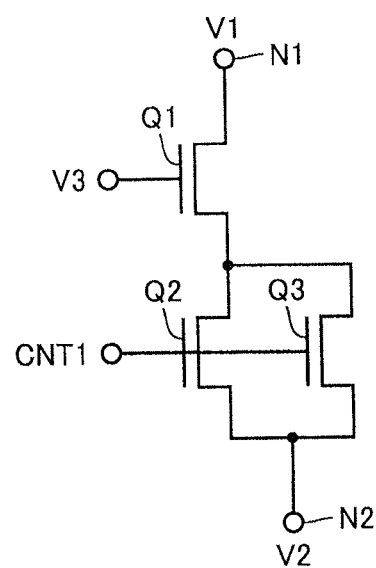
FIG. 8 is a circuit diagram showing still another exemplary variation of the first embodiment.

FIG. 8 is a circuit block diagram showing still another exemplary variation of the first embodiment, as compared with FIG. 1. The FIG. 8 semiconductor device differs from the FIG. 1 semiconductor device in that the former has control signal CNT1 provided to n channel MOS transistors Q2 and Q3 at their gates and has transistor Q3 with threshold voltage VTH3 higher than threshold voltage VTH2 of transistor Q2. Accordingly, when control signal CNT is pulled from low to high, transistor Q2 first turns on and transistor Q3 subsequently turns on. When control signal CNT is pulled from high to low, transistor Q3 first turns off and transistor Q2 subsequently turns off. This exemplary variation has the same effect as the first embodiment and in addition requires a smaller number of control signal CNT.

Furthermore, n channel MOS transistors Q1-Q3 may each be replaced with a bipolar transistor or IGBT. For example, n channel MOS transistors Q1-Q3 may be replaced with first to third npn bipolar transistors, respectively. In that case, the first npn bipolar transistor has a collector connected to node N1, the second npn bipolar transistor has a collector connected to an emitter of the first npn bipolar transistor, and the third npn bipolar transistor is connected to the second npn bipolar transistor in parallel. The first npn bipolar transistor has a base receiving direct current voltage V3 and the second and third npn bipolar transistors have bases receiving control signals CNT1 and CNT2, respectively. The first npn bipolar transistor has a collector-emitter breakdown voltage higher than those of the second and third npn bipolar transistors. The second npn bipolar transistor has an amplification factor smaller than those of the first and third npn bipolar transistors. This case also has the same effect as the first embodiment.

Furthermore, the first npn bipolar transistor may be replaced with an insulated gate bipolar transistor (IGBT). In that case, the IGBT has a collector connected to node N1, an emitter connected to the second and third npn bipolar transistors at their collectors, and a gate receiving direct current voltage V3. The IGBT has a collector-emitter breakdown voltage higher than those of the second and third npn bipolar transistors. The second npn bipolar transistor has an amplification factor smaller than that of each of the third npn bipolar transistor. This case also has the same effect as the first embodiment.

Second Embodiment

Figure 9:
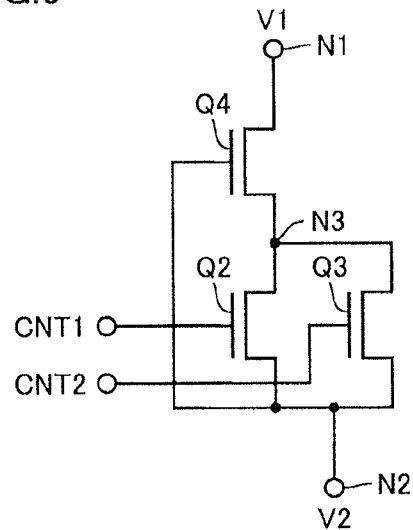
FIG. 9 is a circuit diagram showing a configuration of a semiconductor device by a second embodiment of the present invention.

FIG. 9 is a circuit diagram showing a configuration of a semiconductor device by a second embodiment of the present invention, as compared with FIG. 1. The FIG. 9 semiconductor device differs from the FIG. 1 semiconductor device in that the former has a normally on type transistor Q4 in place of n channel MOS transistor Q1. Normally on type transistor Q4 is implemented for example as a heterojunction field effect GaN transistor.

N channel MOS transistor Q1 has threshold voltage VTH1 having a positive value and turns off for a gate-source voltage of 0 V, and accordingly, it is referred to as a normally off type transistor. In contrast, normally on type transistor Q4 has a threshold voltage VTH4 having a negative value and turns on for the gate-source voltage of 0 V. Transistor Q4 is a high breakdown voltage, high Gm transistor.

Transistor Q4 as commercially available has threshold voltage VTH4 varying within a range of −3 V to −5 V. Transistors Q2 and Q3 as commercially available have threshold voltages VTH2 and VTH3, respectively, varying within a range of 2 V to 3 V. Transistor Q2 has transconductance Gm2 smaller than transconductances Gm3 and Gm4 of transistors Q3 and Q4. For example, Gm2=6 siemens (S), Gm3=30 S, and Gm4=20 S.

When control signals CNT1 and CNT2 are low, transistors Q2 and Q3 are turned off. At the time, normally on type transistor Q4 at its source (or node N3) has a voltage higher than that at node N2 plus threshold voltage VTH4 in absolute value due to current leakage of transistor Q4. Accordingly, transistor Q4 is turned off.

Then, when control signal CNT1 is pulled from low to high, transistor Q2 turns on and the voltage at node N3 decreases, and when node N3 has a difference in voltage from node N2 smaller than threshold voltage VTH4 of transistor Q4 in absolute value, transistor Q4 turns on and an electrically conducting state is established between nodes N1 and N2. Then, when control signal CNT2 is pulled from low to high, transistor Q3 turns on and a value in resistance between nodes N1 and N2 decreases.

When an electrically non conducting state is to be established between nodes N1 and N2, control signal CNT2 is initially pulled from high to low to turn off transistor Q3. Subsequently, control signal CNT1 is pulled from high to low to turn off transistor Q2. When transistors Q2 and Q3 are turned off, the voltage at node N3 increases due to current leakage of transistor Q4, and when node N3 has a difference in voltage from node N2 larger than threshold voltage VTH4 of transistor Q4 in absolute value, transistor Q4 turns off and an electrically non conducting state is established between nodes N1 and N2.

In the second embodiment, transistor Q2 with transconductance Gm2 having a small value is used to switch high breakdown voltage transistor Q4 and hence reduce an effect of variation in threshold voltage VTH4 of transistor Q4 on that of a drain current of transistor Q4, and a turn-on time with only limited variation can thus be achieved.

Furthermore, low breakdown voltage transistor Q2 having threshold voltage VTH2 with small variation can be turned on to turn on high breakdown voltage transistor Q4 having threshold voltage VTH4 with large variation, and a turn-on time with only limited variation can be achieved.

Note that the second embodiment may also have transistor Q3 with threshold voltage VTH3 higher than threshold voltage VTH2 of transistor Q2, and may have transistors Q2 and Q3 with their gates receiving control signal CNT1, as shown in FIG. 8.

Figure 10:
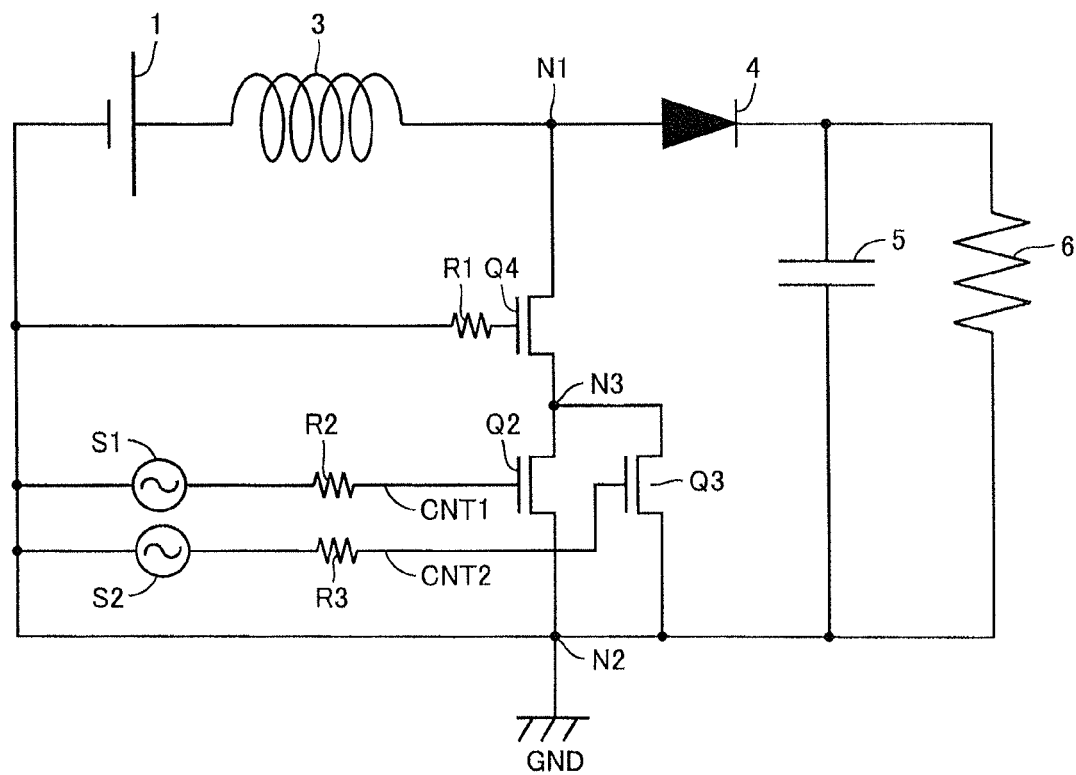
FIG. 10 is a circuit diagram showing a configuration of a boost chopper employing the semiconductor device shown in FIG. 9.

FIG. 10 is a circuit diagram showing a configuration of a boost chopper employing the semiconductor device shown in FIG. 9, as compared with FIG. 2. Normally on type transistor Q4 is connected between node N1 and the drain of transistor Q2, and has a gate connected to a line of ground voltage GND via gate resistor R1. Note that gate resistor R1 may be removed and transistor Q4 may have its gate directly grounded.

When transistors Q2-Q4 are turned on, a direct current flows from direct current power supply 1 via reactor 3 and transistors Q2-Q4 to a line of ground voltage GND, and electromagnetic energy is stored to reactor 3. When transistors Q2-Q4 are turned off, the electromagnetic energy stored in reactor 3 is discharged to capacitor 5 via diode 4. Capacitor 5 will have a voltage between its terminals, i.e., a voltage output from the boost chopper, which is a voltage output from direct current power supply 1 plus that between the terminals of reactor 3.

This boost chopper employs transistor Q2 with transconductance Gm2 having a small value to switch high breakdown voltage transistor Q4 and hence reduce an effect of variation in threshold voltage VTH4 of transistor Q4 on that of a drain current of transistor Q4, and the boost chopper can thus have a current rising at a time varying within only a limited, small range.

Furthermore, transistor Q2 having threshold voltage VTH2 with small variation can be turned on/off, as controlled, to control turning on/off transistor Q4 having threshold voltage VTH4 having a large absolute value, and the boost chopper can thus have a current rising at a time varying within only a limited, small range, as well as in the first embodiment.

Note that normally on type transistor Q4 may be replaced with an IGBT. This case also has the same effect as the second embodiment.

Third Embodiment

A third embodiment provides a semiconductor device including a plurality of sets of first to third transistors, with a plurality of first transistors having their respective gates connected to each other, a plurality of second transistors having their respective gates connected to each other, a plurality of third transistors having their respective gates connected to each other, the plurality of first transistors having their respective sources all connected to a first node, the plurality of second transistors having their respective sources connected to the plurality of first transistors at their respective drains, respectively, the plurality of second transistors having their respective sources all connected to a second node, and the plurality of third transistors connected to the plurality of second transistors, respectively, in parallel. Hereinafter, the semiconductor device of the third embodiment will be described in detail with reference to the drawings.

Figure 11:
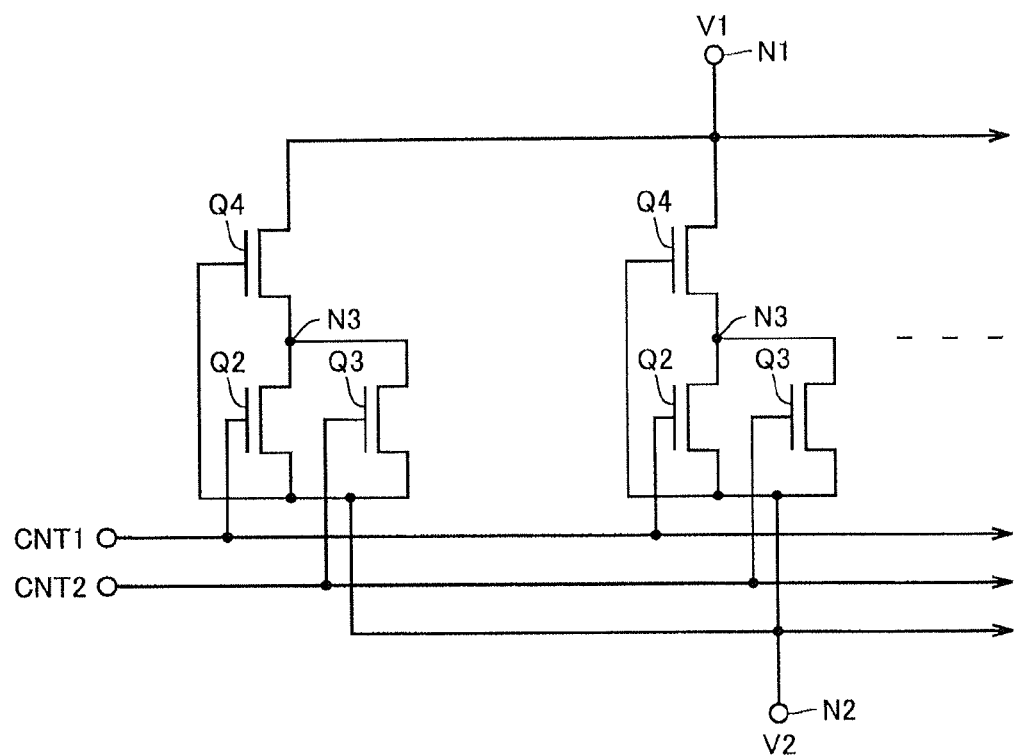
FIG. 11 is a circuit diagram showing a configuration of a semiconductor device by a third embodiment of the present invention.

FIG. 11 is a circuit diagram showing a configuration of the semiconductor device of the third embodiment, as compared with FIG. 9. The semiconductor device of FIG. 11 corresponds to more than one semiconductor device of FIG. 9 connected in parallel. More specifically, a plurality of transistors Q4s have their respective drains all connected to node N1 and their respective gates all connected to node N2. A plurality of transistors Q2s have their respective sources all connected to node N2 and their respective gates all receiving control signal CNT1. A plurality of transistors Q3s have their respective sources all connected to node N2 and their respective gates all receiving control signal CNT2.

When control signal CNT1 is pulled from low to high, all transistors Q2s turn on and all transistors Q4s turn on. At the time, low breakdown voltage, low Gm transistor Q2 is turned on to turn on high breakdown voltage, high Gm transistor Q4, and all transistors Q4s can thus be turned on. Note that if transistor Q2 is a high Gm transistor, a current may flow to a single transistor Q4 intensively and the remaining transistors Q4s may not have a current passing therethrough.

Transistor Q2 has a smaller current driving ability than transistor Q4 does, and this does not allow transistor Q4 to exhibit its ability sufficiently. Accordingly, control signal CNT2 is subsequently pulled from low to high to turn on low breakdown voltage, high Gm transistor Q3. This establishes an electrically conducting state between nodes N1 and N2.

When an electrically non conducting state is to be established between nodes N1 and N2, control signal CNT2 is initially pulled from high to low to turn off all transistors Q3s. Subsequently, control signal CNT1 is pulled from high to low to turn off all transistors Q2s and Q4s.

In the third embodiment, low breakdown voltage, low Gm transistor Q2 is turned on to turn on high breakdown voltage, high Gm transistor Q4, and thereafter, low breakdown voltage, high Gm transistor Q3 is turned on. This allows a current to be distributed to all transistors Q4s and can prevent a current from flowing intensively to a single transistor Q4. Furthermore, in contrast to PTD 1, a current sensor or the like can be dispensed with, and a device simplified in configuration and reduced in cost can be achieved.

Figure 12:
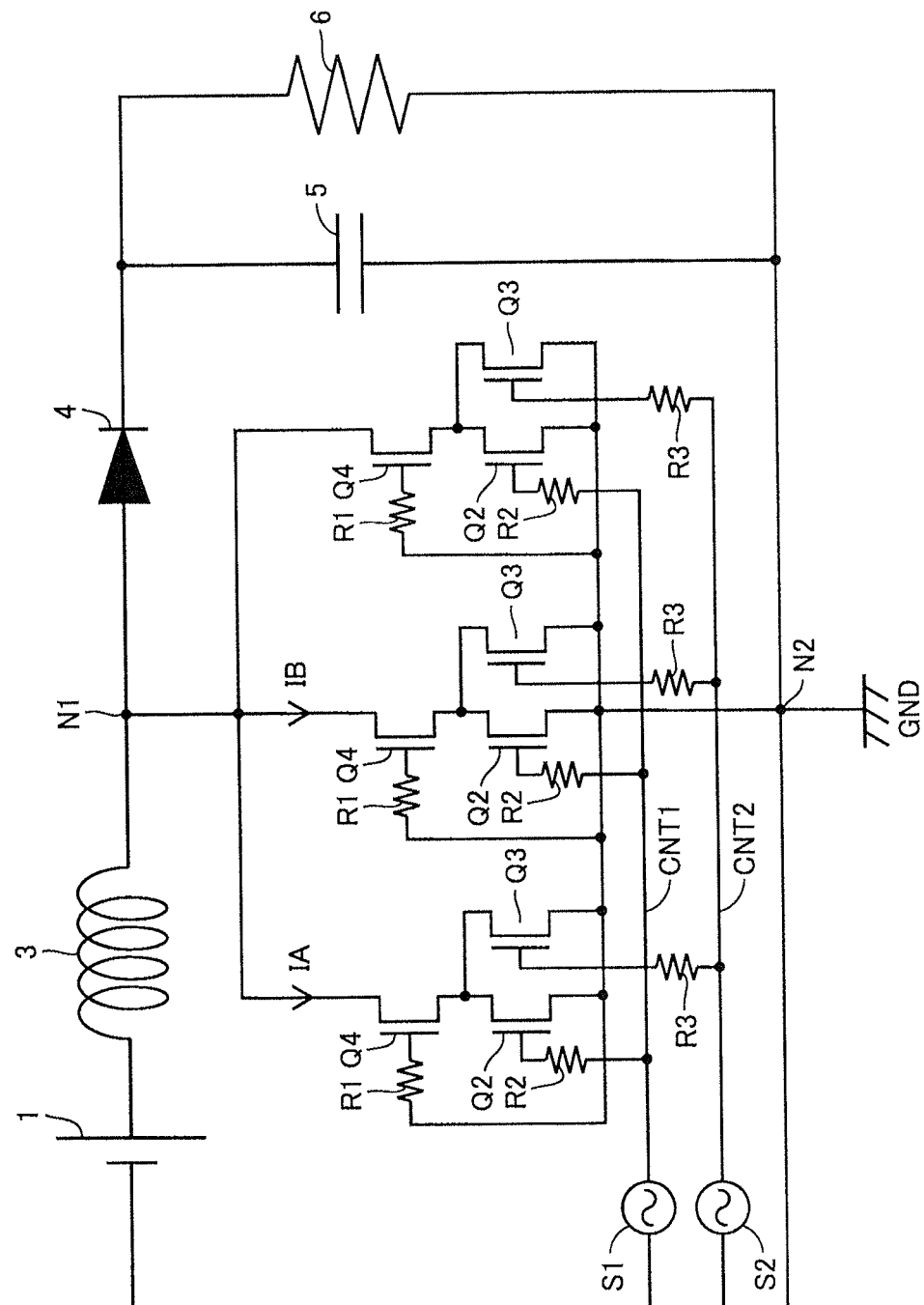
FIG. 12 is a circuit diagram showing a configuration of a boost chopper employing the semiconductor device shown in FIG. 11.

FIG. 12 is a circuit diagram showing a configuration of a boost chopper employing the semiconductor device shown in FIG. 11, as compared with FIG. 10. FIG. 12 shows three semiconductor devices of FIG. 9 connected in parallel. Three normally on type transistors Q4s have their respective gates each connected to node N2 via gate resistor R1. Three transistors Q2s have their respective gates each connected via gate resistor R2 to an output node of control signal source S1. Three transistors Q3s have their respective gates each connected via gate resistor R3 to an output node of control signal source S2.

Transistors Q2, Q3, Q4 have transconductance Gm of 6 S, 30 S, 20 S, respectively. Three transistors Q4s have threshold voltage VTH4 of −4.2 V, −4.0 V, −4.0 V, respectively. Three transistors Q2s have threshold voltage VTH of 2.2 V, 2.4 V, 2.4 V, respectively. Three transistors Q3s have threshold voltage VTH3 of 2.4 V, 2.6 V, 2.6 V, respectively. Gate resistor R1 has a value in resistance of 10 ohms, and gate resistors R2 and R3 both have a value in resistance of 100 ohms.

When transistors Q2-Q4 are turned on, a direct current flows from direct current power supply 1 via reactor 3 and transistors Q2-Q4 to a line of ground voltage GND, and electromagnetic energy is stored to reactor 3. When transistors Q2-Q4 are turned off, the electromagnetic energy stored in reactor 3 is discharged to capacitor 5 via diode 4. Capacitor 5 will have a voltage between its terminals, i.e., a voltage output from the boost chopper, which is a voltage output from direct current power supply 1 plus that between the terminals of reactor 3.

Figure 13:
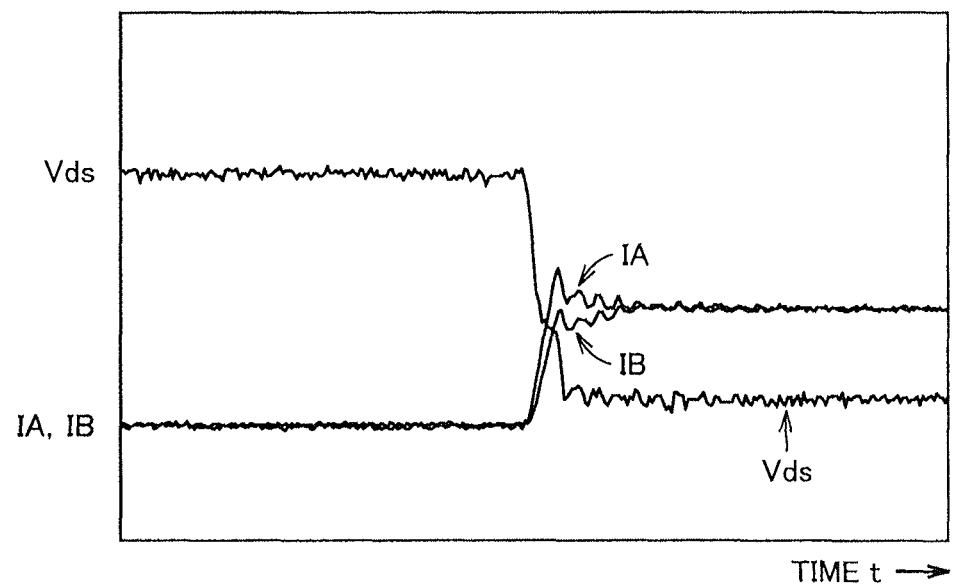
FIG. 13 is timing plots each representing currents passing through two high breakdown voltage transistors shown in FIG. 12 in waveform.
Figure 13:
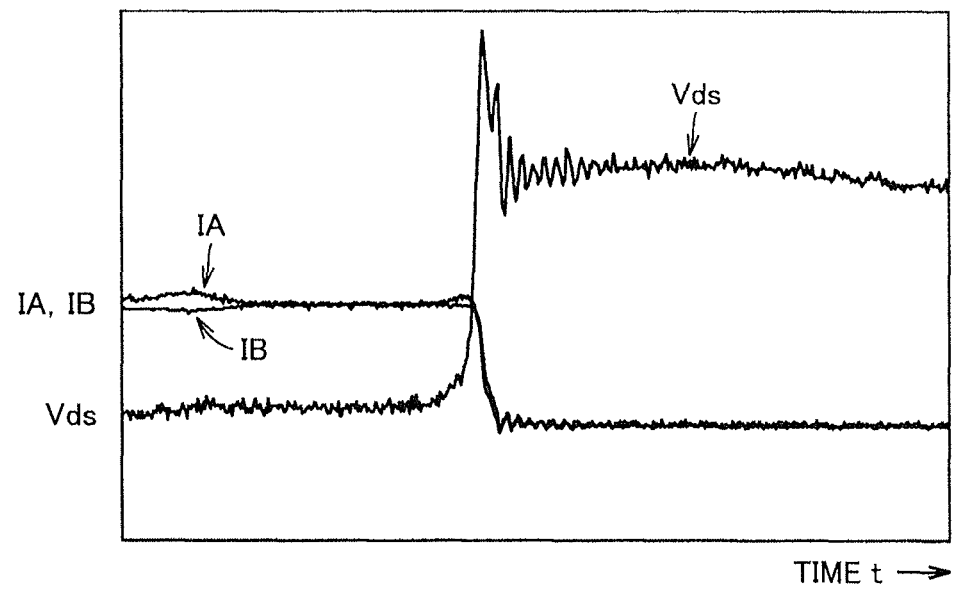

FIG. 13(a) is a timing plot representing, in waveform, voltage Vds between node N1 and node N2 provided when transistors Q2-Q4 turn on, and a current IA passing through transistor Q4 shown in FIG. 12 at a left side and a current IB passing through transistor Q4 shown in FIG. 12 at the center. In FIG. 13(a), transistors Q2-Q4 turn on at a time, and in response, voltage Vds between node N1 and node N2 rapidly decreases, and currents IA and IB both increase.

FIG. 13(b) is a timing plot representing, in waveform, voltage Vds between nodes N1 and N2 provided when transistors Q2-Q4 turn off, and current IA passing through transistor Q4 shown in FIG. 12 at the left side and current IB passing through transistor Q4 shown in FIG. 12 at the center. In FIG. 13(b), transistors Q2-Q4 turn off at a time, and in response, voltage Vds between node N1 and node N2 rapidly increases, and currents IA and IB both decrease. As can be seen from FIG. 13(a) and FIG. 13(b), when transistors Q2-Q4 turn on, two transistors Q4s have currents of substantially equal values passing therethrough substantially concurrently, and so do they when transistors Q2-Q4 turn off.

Figure 14:
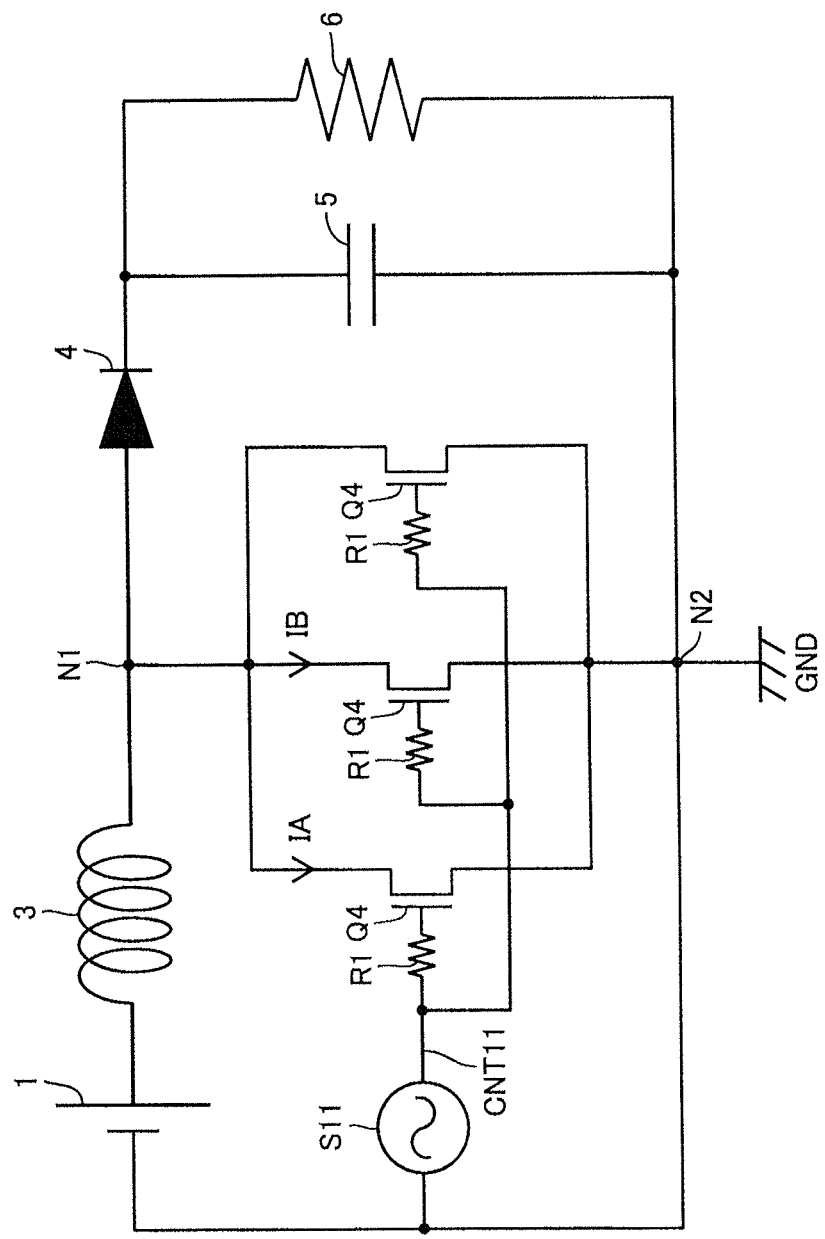
FIG. 14 is a circuit diagram showing a comparative example for the third embodiment.

FIG. 14 is a circuit diagram showing a configuration of a conventional boost chopper serving as a comparative example for the third embodiment, as compared with FIG. 12. With reference to FIG. 14, this boost chopper has three normally on type transistors Q4s connected between nodes N1 and N2. Three transistors Q4s have their respective gates each connected via gate resistor R1 to an output node of a control signal source S11. Control signal source S11 outputs a control signal S11 that is a 10-kHz rectangular wave signal. Control signal source S11 has a ground node grounded.

Three transistors Q4s all have transconductance Gm of 20 S. Three transistors Q4s have threshold voltage VTH of −4.2 V, −4.0 V, −4.0 V, respectively. Three gate resistors R1s all have a value in resistance of 100 ohms. Three transistors Q4s have their respective gates equally in parasitic inductance, their respective drains equally in parasitic inductance, and their respective sources equally in parasitic inductance.

When control signal S11 is pulled from low (e.g., −6 V) to high (e.g., −2 V), transistor Q4 turns on and electromagnetic energy is stored to reactor 3. When control signal S11 is pulled from high to low, transistor Q4 turns off and the electromagnetic energy of reactor 3 is discharged to capacitor 5.

Figure 15:
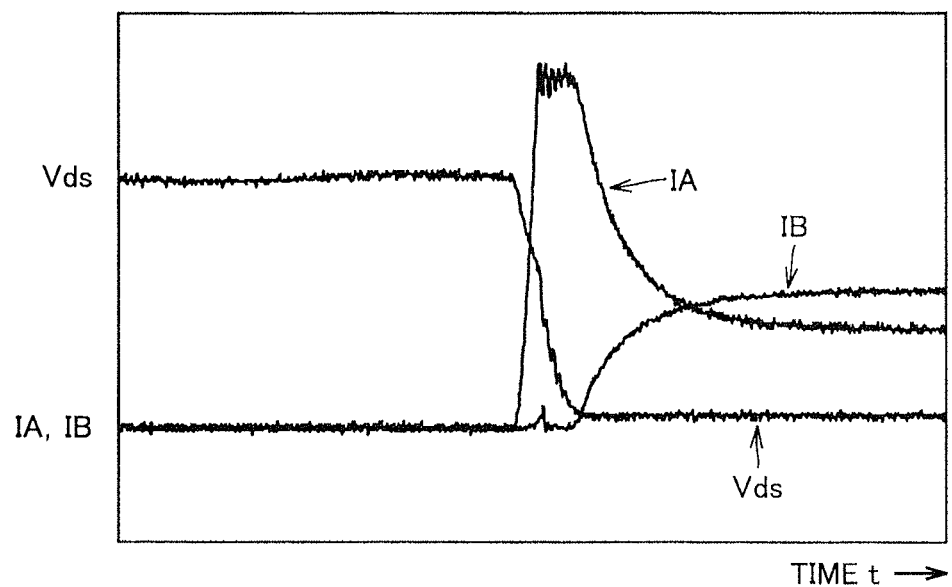
FIG. 15 is timing plots each representing currents passing through two high breakdown voltage transistors shown in FIG. 14 in waveform.
Figure 15:
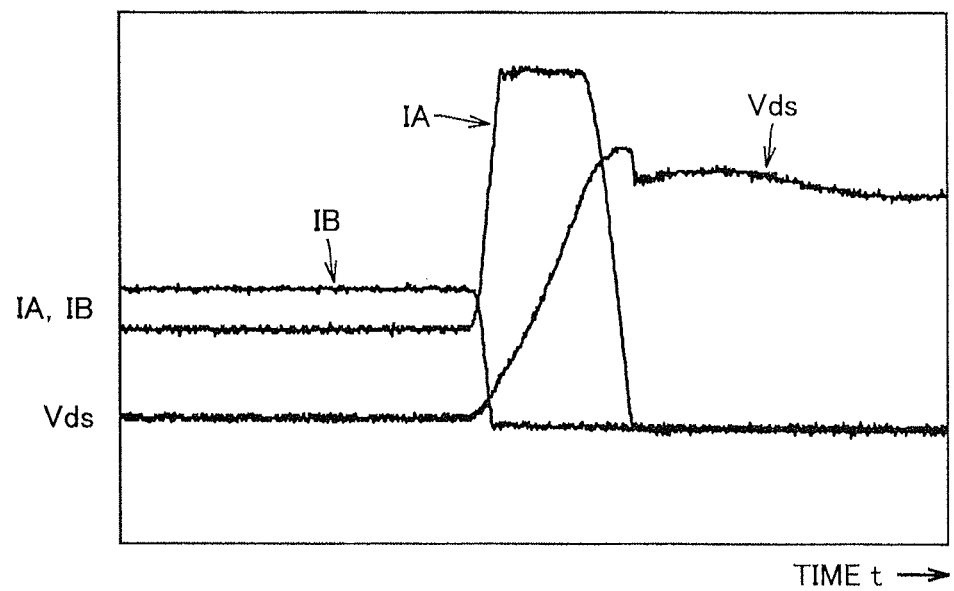

FIG. 15(a) is a timing plot representing, in waveform, voltage Vds between nodes N1 and N2 provided when transistor Q4 turns on, and current IA passing through transistor Q4 shown in FIG. 14 at the left side and current IB passing through transistor Q4 shown in FIG. 14 at the center. In FIG. 15(a), control signal CNT11 is pulled from low to high at a time, and in response, the leftward transistor Q4, which has a low threshold voltage, turns on faster than the center transistor Q4, and accordingly has current IA rapidly increased, and voltage Vds rapidly decreases. Then, when the center transistor Q4, which has a high threshold voltage, turns on and accordingly has current IB increased, the leftward transistor Q4 has current IA decreased.

FIG. 15(b) is a timing plot representing, in waveform, voltage Vds between nodes N1 and N2 provided when transistor Q4 turns off, and current IA passing through transistor Q4 shown in FIG. 14 at the left side and current IB passing through transistor Q4 shown in FIG. 14 at the center. In FIG. 15(b), control signal CNT11 is pulled from high to low at a time, and in response, the center transistor Q4, which has a high threshold voltage, turns off faster than the leftward transistor Q4, and accordingly, current I13 decreases and current IA rapidly increases. Then, the leftward transistor Q4, having a low threshold value, turns off, and current IA decreases.

Thus a conventional boost chopper with a plurality of transistors Q4s connected in parallel will have one transistor Q4 that has a low threshold value receiving a current intensively. It may be possible to previously measure transistors Q4s for threshold voltage and use a plurality of transistors Q4s equal in threshold voltage to configure a boost chopper. This, however, is costly. Furthermore, the method of PTD 1 would result in a device having a complicated configuration and hence being costly, as has been set forth above.

In contrast, the boost chopper of the present invention can be inexpensively and simply configured to allow a plurality of transistors Q4s to have currents, respectively, passing therethrough equally to prevent a current from intensively flowing to and thus damaging transistor Q4.

Fourth Embodiment

Figure 16:
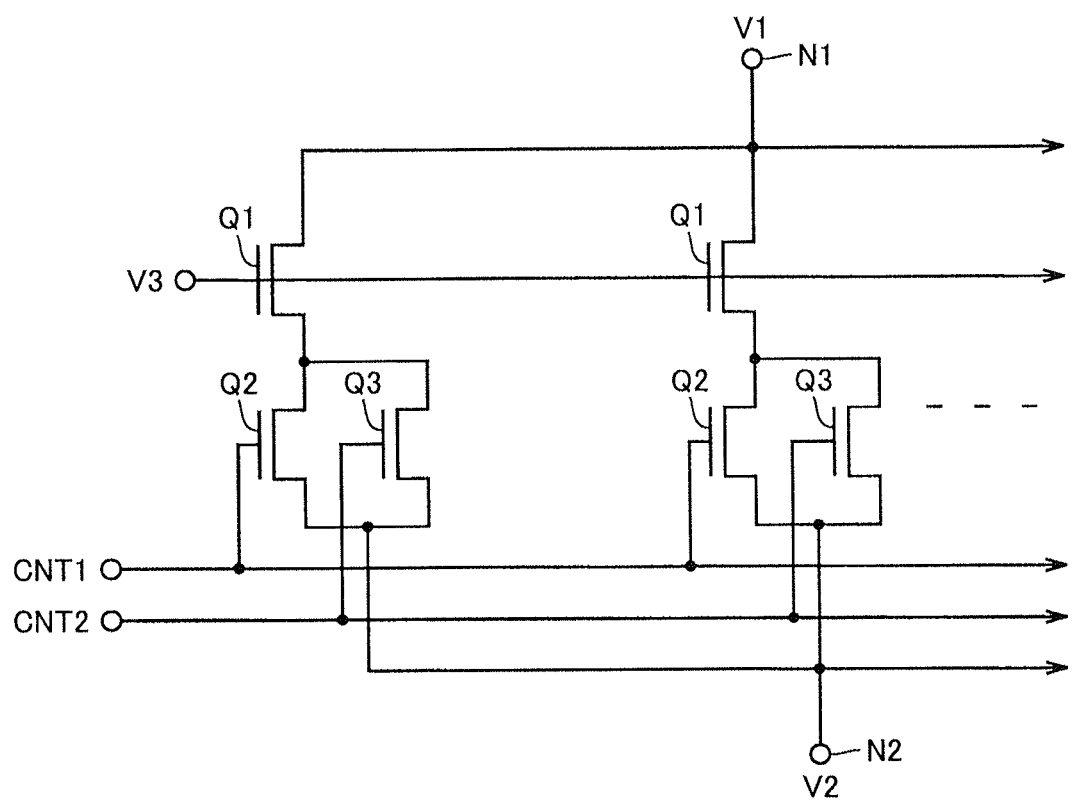
FIG. 16 is a circuit diagram showing a configuration of a semiconductor device by a fourth embodiment of the present invention.

FIG. 16 is a circuit diagram showing a configuration of a semiconductor device of a fourth embodiment of the present invention, as compared with FIG. 1. The semiconductor device of FIG. 16 corresponds to more than one semiconductor device of FIG. 1 connected in parallel. More specifically, a plurality of transistors Q1s have their respective drains all connected to node N1 and their respective gates all receiving direct current voltage V3. A plurality of transistors Q2s have their respective sources all connected to node N2 and their respective gates all receiving control signal CNT1. A plurality of transistors Q3s have their respective sources all connected to node N2 and their respective gates all receiving control signal CNT2.

When control signal CNT1 is pulled from low to high, all transistors Q2s turn on and all transistors Q1s turn on. At the time, low breakdown voltage, low Gm transistor Q2 is turned on to turn on high breakdown voltage, high Gm transistor Q1, and all transistors Q1s can be turned on. Note that if transistor Q2 is a high Gm transistor, a current may flow intensively to a single transistor Q1 and the remaining transistors Q1s may not have a current passing therethrough.

Transistor Q2 has a smaller current driving ability than transistor Q1 does, and this does not allow transistor Q1 to exhibit its ability sufficiently. Accordingly, control signal CNT2 is subsequently pulled from low to high to turn on low breakdown voltage, high Gm transistor Q3. This establishes an electrically conducting state between nodes N1 and N2.

When an electrically non conducting state is to be established between nodes N1 and N2, control signal CNT2 is initially pulled from high to low to turn off all transistors Q3s. Subsequently, control signal CNT1 is pulled from high to low to turn off all transistors Q1s and Q2s.

In the fourth embodiment, low breakdown voltage, low Gm transistor Q2 is turned on to turn on high breakdown voltage, high Gm transistor Q1, and thereafter, low breakdown voltage, high Gm transistor Q3 is turned on. This allows a current to be distributed to all transistors Q1s and can prevent a current from flowing intensively to a single transistor Q1. Furthermore, in contrast to PTD 1, a current sensor or the like can be dispensed with, and a device simplified in configuration and reduced in cost can be achieved.

Figure 17:
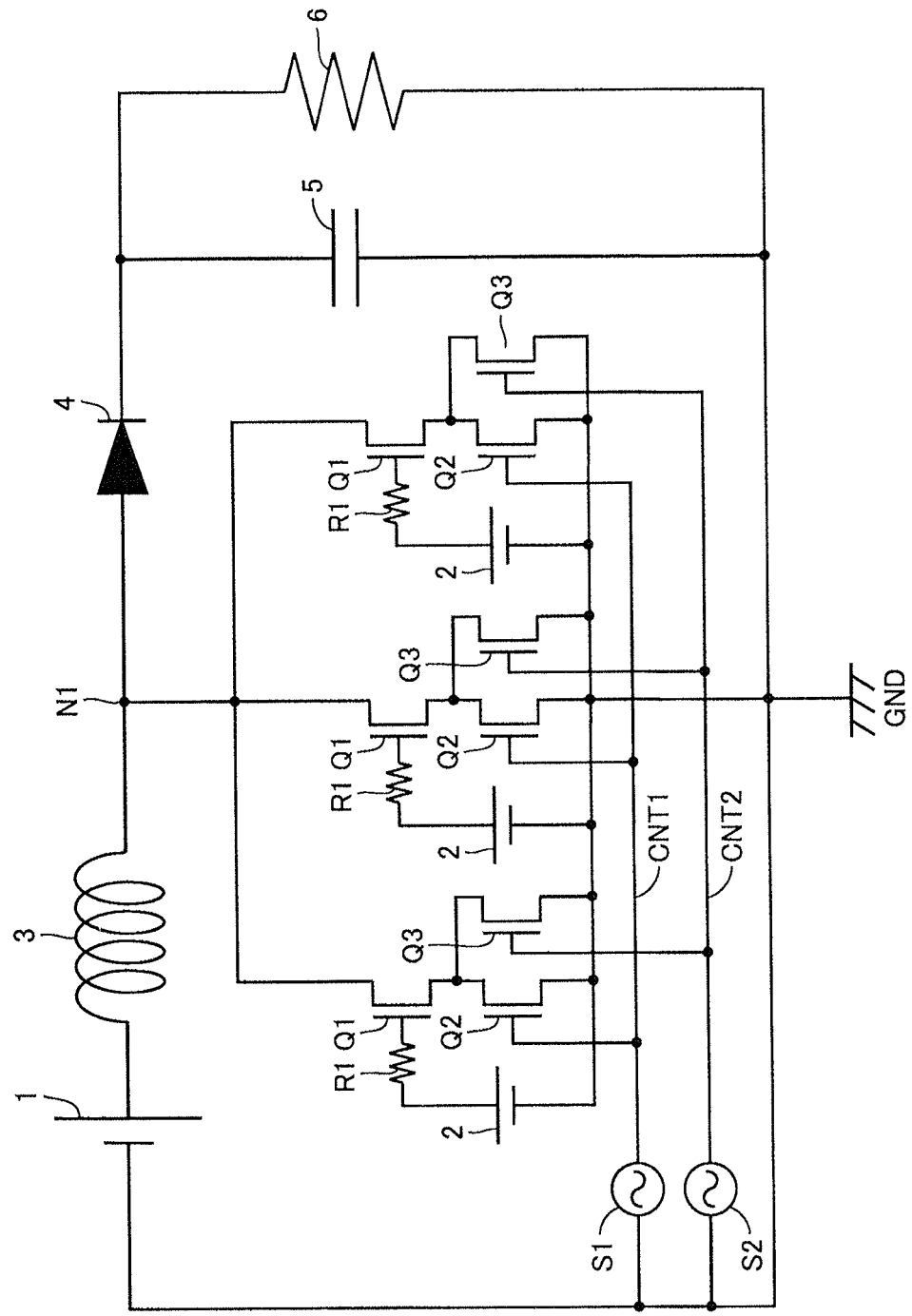
FIG. 17 is a circuit diagram showing a configuration of a boost chopper employing the semiconductor device shown in FIG. 16.

FIG. 17 is a circuit diagram showing a configuration of a boost chopper employing the semiconductor device shown in FIG. 16, as compared with FIG. 2. FIG. 17 shows three semiconductor devices of FIG. 1 connected in parallel. Three transistors Q1s have their respective gates each connected via gate resistor R1 to a positive electrode of direct current power supply 2 and receiving direct current voltage V3. Three transistors Q2s have their respective gates each connected to an output node of control signal source S1. Three transistors Q3s have their respective gates each connected to an output node of control signal source S2.

Transistors Q1, Q2, Q3 have transconductance Gm of 35 S, 6 S, 30 S, respectively. Three transistors Q1s have threshold voltage VTH1 of 4.2 V, 4.0 V, 4.0 V, respectively. Three transistors Q2s have threshold voltage VTH2 of 1.2 V, 1.4 V, 1.4 V, respectively. Three transistors Q3s have threshold voltage VTH3 of 1.4 V, 1.6 V, 1.6 V, respectively. Gate resistor R1 has a value in resistance of 10 ohms, and gate resistors R2 and R3 both have a value in resistance of 100 ohms.

When transistors Q1-Q3 are turned on, a direct current flows from direct current power supply 1 via reactor 3 and transistors Q1-Q3 to a line of ground voltage GND, and electromagnetic energy is stored to reactor 3. When transistors Q1-Q3 are turned off, the electromagnetic energy stored in reactor 3 is discharged to capacitor 5 via diode 4. Capacitor 5 will have a voltage between its terminals, i.e., a voltage output from the boost chopper, which is a voltage output from direct current power supply 1 plus that between the terminals of reactor 3. This boost chopper, as well as that of the third embodiment, allows three transistors Q1s to have equal currents, respectively, passing therethrough.

Fifth Embodiment

Figure 18:
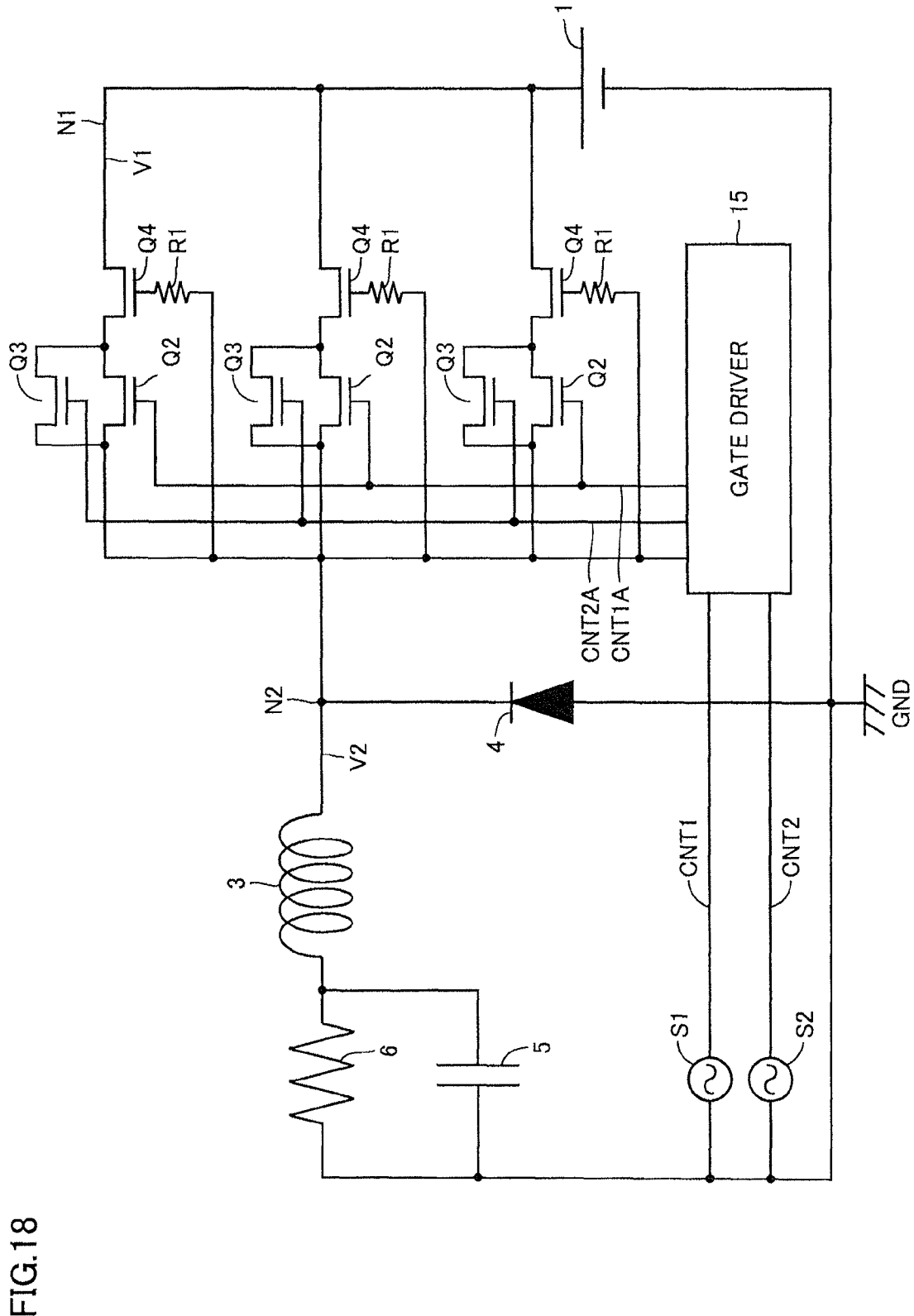
FIG. 18 is a circuit block diagram showing a configuration of a buck-boost chopper by a fifth embodiment of the present invention.

FIG. 18 is a circuit diagram showing a configuration of a buck-boost chopper of a fifth embodiment of the present invention, as compared with FIG. 12. The FIG. 18 buck-boost chopper, as well as the FIG. 12 boost chopper, has a plurality (three in FIG. 18) of semiconductor devices of FIG. 9 connected in parallel. Furthermore, this buck-boost chopper includes three gate resistors R1s, direct current power supply 1, reactor 3, diode 4, capacitor 5, control signal sources S1 and S2, and a gate driver 15.

Three normally on type transistors Q4s have their respective drains all connected to node N1. Each transistor Q4 has its gate connected to node N2 via gate resistor R1. Three n channel MOS transistors Q2s have their respective drains connected to three transistors Q4s at their respective sources, their respective sources all connected to node N2, and their respective gates all receiving a control signal CNT1A. Three transistors Q3s have their respective drains connected to three transistors Q4s at their respective sources, their respective sources all connected to node N2, and their respective gates all receiving a control signal CNT2A.

Node N1 is connected to a positive electrode of direct current power supply 1 and receives direct current voltage V1 (for example of 300 V). Direct current power supply 1 has a negative electrode receiving ground voltage GND. Control signal sources S1 and S2 generate control signals CNT1 and CNT2, respectively. Gate driver 15 generates control signals CNT1A and CNT2A based on voltage V2 on node N2 and control signals CNT1 and CNT2. Control signals CNT1A and CNT2A have a low level equal in voltage to voltage V2 on node N2. Control signals CNT1A and CNT2A have a high level equal in voltage to control signals CNT1 and CNT2, respectively, in voltage (12 V) plus voltage V2 on node N2.

Diode 4 has an anode connected to a line of ground voltage GND and a cathode connected to node N2. Reactor 3 has one terminal connected to node N2. Capacitor 5 is connected between the other terminal of reactor 3 and a line of ground voltage GND. Load circuit 6 is connected to capacitor 5 in parallel.

When control signal CNT1A is pulled from low to high, all transistors Q2s turn on and all transistors Q4s turn on. At the time, low breakdown voltage, low Gm transistor Q2 is turned on to turn on high breakdown voltage, high Gm transistor Q4, and all transistors Q4s can be turned on. Note that if transistor Q2 is a high Gm transistor, a current may flow intensively to a single transistor Q4 and the remaining transistors Q4s may not have a current passing therethrough.

Transistor Q2 has a smaller current driving ability than transistor Q4 does, and this does not allow transistor Q4 to exhibit its ability sufficiently. Accordingly, then, control signal CNT2A is subsequently pulled from low to high to turn on low breakdown voltage, high Gm transistor Q3. This establishes an electrically conducting state between nodes N1 and N2.

When an electrically non conducting state is to be established between nodes N1 and N2, control signal CNT2A is initially pulled from high to low to turn off all transistors Q3s. Subsequently, control signal CNT1A is pulled from high to low to turn off all transistors Q2s and Q4s.

When transistors Q2-Q4 are turned on, as described above, a direct current flows through a route extending from a positive electrode of direct current power supply 1 via and transistors Q4, Q2, Q3, reactor 3 and capacitor 5 and thus reaching a negative electrode of direct current power supply 1, and capacitor 5 is charged and electromagnetic energy is stored to reactor 3. When transistors Q2-Q4 are turned off, the electromagnetic energy stored in reactor 3 allows a direct current to flow through a route of reactor 3, capacitor 5, and diode 4. The voltage between the terminals of capacitor 5, i.e., the voltage output from the buck-boost chopper, is applied to load circuit 6.

Transistors Q2-Q4 are turned on/off periodically. Transistors Q2-Q4 turned on and off for periods of time, respectively, with a large ratio therebetween, as observed in a single cycle, result in capacitor 5 having an increased voltage between the terminals. In contrast, transistors Q2-Q4 turned on and off for periods of time, respectively, with a small ratio therebetween, as observed in a single cycle, result in capacitor 5 having a decreased voltage between the terminals. Transistors Q2-Q4 turned on and off for periods of time, respectively, with an adjusted ratio therebetween, as observed in a single cycle, allow capacitor 5 to have a voltage between the terminals adjusted to a desired voltage between direct current voltage V3 and ground voltage GND. This buck-boost chopper also allows three transistors Q4s to have equal currents, respectively, passing therethrough.

Note that the FIG. 18 semiconductor device including three sets of transistors Q2-Q4 can also be used to configure each of upper and lower arms to configure an inverter.

Figure 19:
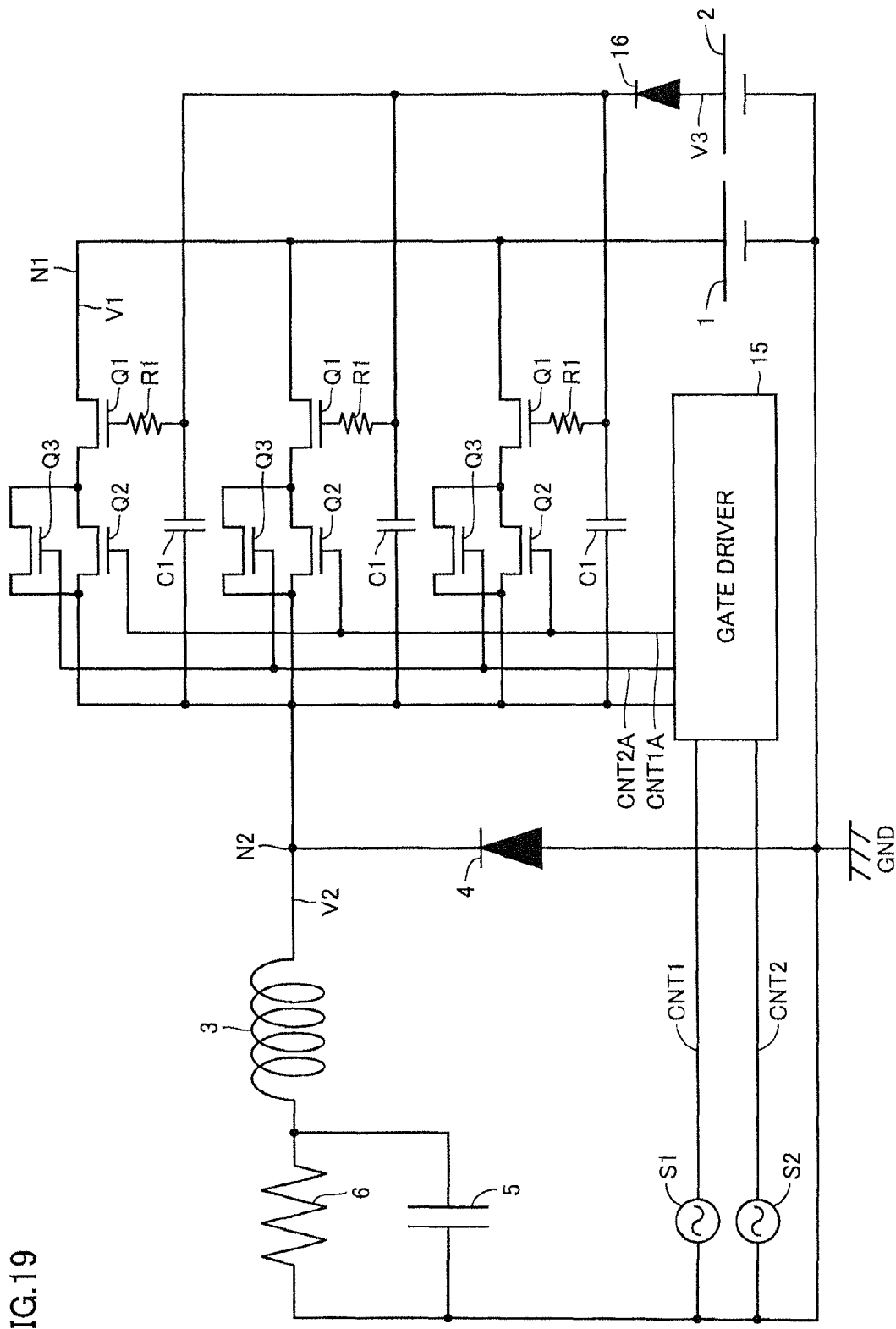
FIG. 19 is a circuit block diagram showing an exemplary variation of the fifth embodiment.

FIG. 19 is a circuit block diagram showing a buck-boost chopper serving as an exemplary variation of the fifth embodiment, as compared with FIG. 18. The FIG. 19 buck-boost chopper differs from the FIG. 18 buck-boost chopper in that the former has n channel MOS transistor Q1 in place of each normally on type transistor Q4 and additionally includes direct current power supply 2, a diode 16, and three capacitors C1s.

Direct current power supply 2 has a negative electrode receiving ground voltage GND. Diode 16 has an anode connected to a positive electrode of direct current power supply 2 and receives direct current voltage V3 (for example of 12 V). Direct current voltage V3 is sufficiently higher than the threshold voltage of transistor Q1. Each capacitor C1 is connected between the cathode of diode 16 and node N2. Each gate resistor R1 is connected between the gate of transistor Q1 associated therewith and the cathode of diode 16. Thus transistor Q1 has a gate receiving voltage higher by direct current voltage V2 than node N2, which ensures that when control signal CNT1A is pulled high and transistor Q2 is turned on, transistor Q1 is turned on. The remainder in configuration and operation is identical to that of the FIG. 18 buck-boost chopper and will not be described repeatedly. This buck-boost chopper also allows three transistors Q1s to have equal currents, respectively, passing therethrough.

Note that the FIG. 19 semiconductor device including three sets of transistors Q1-Q3 can also be used to configure each of upper and lower arms to configure an inverter.

It is needless to say that the first to fifth embodiments and a variety of exemplary variations thereof may be combined as appropriate.

It should be understood that the embodiments disclosed herein are illustrative and non-restrictive in any respect. The scope of the present invention is defined by the terms of the claims, rather than the description above, and is intended to include any modifications within the scope and meaning equivalent to the terms of the claims.

REFERENCE SIGNS LIST

Q1-Q3, Q10: n channel MOS transistor, 1, 2: direct current power supply, 3: reactor, 4, 11, 16: diode, 5, 12, C1: capacitor, 6, 10, 14: load circuit, 13: alternating current power supply, 15: gate driver, S1, S2, S10: control signal source, R1-R3: gate resistor, SW1-SW4, SW11-SW14: switch, Q4: normally on type transistor.

The invention claimed is:

1. A semiconductor device comprising:
a first transistor having a first electrode connected to a first node;
a second transistor having a first electrode connected to a second electrode of said first transistor, and a second electrode connected to a second node;
a third transistor having a first electrode connected to said second electrode of said first transistor, and a second electrode connected to said second node,
said first transistor having a higher breakdown voltage between said first and second electrodes than said second and third transistors do,
said second transistor having an amplification factor smaller than that of said third transistor,
wherein the semiconductor device includes a plurality of sets of said first to third transistors,
a plurality of the first transistors have first electrodes, respectively, all connected to said first node,
a plurality of the second transistors have first electrodes, respectively, connected to said plurality of said first transistors at second electrodes, respectively,
said plurality of the second transistors have second electrodes, respectively, all connected to said second node, a plurality of the third transistors have first electrodes, respectively, connected to said plurality of said first transistors at said second electrodes, respectively, said plurality of the third transistors have second electrodes, respectively, all connected to said second node, said plurality of the first transistors have control electrodes, respectively, all connected to a first control node, said plurality of the second transistors have control electrodes, respectively, all connected to a second control node;

said plurality of the third transistors have control electrodes, respectively, all connected to a third control node, and the second control node and the third control node are different and configured to send respective control signals at different timings.

2. The semiconductor device according to claim 1, further comprising:
a first resistive element associated with each said first transistor;
a second resistive element associated with each said second transistor; and
a third resistive element associated with each said third transistor, wherein:
each said first transistor has said control electrode connected to said first control node via said first resistive element associated therewith;
each said second transistor has said control electrode connected to said second control node via said second resistive element associated therewith; and
each said third transistor has said control electrode connected to said third control node via said third resistive element associated therewith.

3. The semiconductor device according to claim 1, wherein said second transistor has said amplification factor to be smaller than that of said first transistor.

4. The semiconductor device according to claim 1, wherein an electrically conducting state is established between said first and second nodes by turning on said second transistor to turn on said first transistor and thereafter turning on said third transistor.

5. The semiconductor device according to claim 4, wherein an electrically non conducting state is established between said first and second nodes by turning off said third transistor and thereafter turning off said second transistor to turn off said first transistor.

6. The semiconductor device according to claim 1, wherein:
said first node receives a first voltage;
said second node receives a second voltage;
a first control signal is provided to of said second control node to control turning on/off said second transistor; and
a second control signal is provided to of said third control node to control turning on/off said third transistor.

7. The semiconductor device according to claim 6, wherein said second and third transistors are each a normally off type transistor.

8. The semiconductor device according to claim 6, wherein:
said first transistor is a normally off type transistor; and
said first control node receives a third voltage higher than a threshold voltage of said first transistor.

9. The semiconductor device according to claim 8, further comprising:
a capacitor connected between said first control node and said second node; and
a diode having a cathode connected to said first control node, and an anode receiving said third voltage.

10. The semiconductor device according to claim 6, wherein:
said first transistor is a normally on type transistor; and
said first control node is connected to said second node.

11. The semiconductor device according to claim 1, wherein:
said first node receives a first voltage;
said second node receives a second voltage;
said second transistor has a threshold voltage lower than that of said third transistor; and
a control signal is provided to said second and third control nodes, respectively, to control turning on/off said second and third transistors.

12. The semiconductor device according to claim 11, wherein said second and third transistors are each a normally off type transistor.

13. The semiconductor device according to claim 11, wherein:
said first transistor is a normally off type transistor; and
said first control node receives a third voltage higher than a threshold voltage of said first transistor.

14. The semiconductor device according to claim 13, further comprising:
a capacitor connected between said first control node and said second node; and
a diode having a cathode connected to said first control node, and an anode receiving said third voltage.

15. The semiconductor device according to claim 11, wherein:
said first transistor is a normally on type transistor; and
said first control node is connected to said second node.

16. A converter comprising a semiconductor device according to claim 1.

17. An inverter comprising a semiconductor device according to claim 1.

18. A power conversion device comprising a semiconductor device according to claim 1.

19. The semiconductor device according to claim 2, wherein:
said first resistive element has one terminal connected to said control electrode of said first transistor associated therewith and has the other terminal connected to said first control node;
said second resistive element has one terminal connected to said control electrode of said second transistor associated therewith and has the other terminal connected to said second control node; and
said third resistive element has one terminal connected to said control electrode of said third transistor associated therewith and has the other terminal connected to said third control node.

20. The semiconductor device according to claim 1, wherein each set of the plurality sets of the first to third transistors include only three transistors.

* * * * *